United States Patent [19]

Goth

[11] 4,151,010

[45] Apr. 24, 1979

[54] FORMING ADJACENT IMPURITY REGIONS IN A SEMICONDUCTOR BY OXIDE MASKING

[75] Inventor: George R. Goth, Poughkeepsie, N.Y.

[73] Assignee: International Business Machines Corporation, Armonk, N.Y.

[21] Appl. No.: 920,924

[22] Filed: Jun. 30, 1978

[51] Int. Cl.² .................... H01L 21/26; H01L 21/225
[52] U.S. Cl. ...................................... 148/1.5; 29/571; 148/187; 148/188
[58] Field of Search ............... 148/187, 1.5, 188; 29/571

[56] References Cited

U.S. PATENT DOCUMENTS

| Re. 28,653 | 12/1975 | Murphy | 148/175 |
|---|---|---|---|
| 3,398,029 | 8/1968 | Yasufuku et al. | 148/187 |
| 3,771,218 | 11/1973 | Langdon | 29/578 |
| 3,880,682 | 4/1975 | Muller | 148/175 |
| 3,886,004 | 5/1975 | Bruchez | 148/187 |
| 3,899,372 | 8/1975 | Esch et al. | 148/187 |
| 3,910,804 | 10/1975 | Alcott | 148/188 |
| 3,928,082 | 12/1975 | Schwettmann et al. | 148/1.5 |
| 3,986,896 | 10/1976 | Veno et al. | 148/1.5 |
| 4,049,477 | 9/1977 | Ligon | 148/187 |
| 4,062,699 | 12/1977 | Armstrong | 148/1.5 |

OTHER PUBLICATIONS

Chappelow et al., IBM TDB, vol. 16, No. 5, Oct. 1973, pp. 1617, 1617 A.
Hornung et al., IBM TDB, vol. 17, No. 1, Jun. 1974, pp. 115 and 116.
Lee, IBM TDB, vol. 20, No. 6, Nov. 1977, pp. 2233 and 2234.
Mueller et al., IBM TDB, vol. 19, No. 13, Aug. 1976, p. 865-866.

*Primary Examiner*—G. Ozaki
*Attorney, Agent, or Firm*—Thomas F. Galvin

[57] ABSTRACT

A method for forming adjacent impurity regions of differing conductivities in a semiconductor substrate without using lithography. N type impurities of a first conductivity are introduced into the substrate to form first impurity regions. The substrate is then oxidized to create a mask having a thickness which is greater over the N type impurity regions than over the remainder of the substrate. A portion of the masking layer is then removed, preferably by dip-etching, to a depth which is sufficient to re-expose the substrate only. Impurities of a second conductivity are then introduced in the substrate adjacent the N type impurity regions, with the remaining portion of the mask protecting the N type impurity regions from introduction of the second impurities therein.

23 Claims, 20 Drawing Figures

FORMING ADJACENT IMPURITY REGIONS IN A SEMICONDUCTOR BY OXIDE MASKING

BACKGROUND OF THE INVENTION

1. Field of the Invention

This invention relates generally to the fabrication of semiconductor integrated circuit devices. In particular my invention is concerned with forming adjacent impurity regions within semiconductor substrates.

2. Description of the Prior Art

The formation of the various impurity regions required to fabricate integrated circuit transistors, diodes, resistors, etc., in a semiconductor chip requires very accurate positioning. It is necessary to very accurately control the alignment of the successive lithographic masks that are used for forming the impurity regions. Complex structures, such as bipolar and advanced FET integrated circuit devices, require a large number of masking steps; and successive masking operations depend to a large extent on the accuracy of the previous masking steps.

The allotted spacing between the apertures in lithographic masks must allow for mask misalignment, incorrect aperture size, overetching, etc. Said spacing becomes quite critical as the number of masks increases. However, these tolerance allowances waste space so as to reduce the packing density of the circuit elements on the substrate.

Typically, distinct impurity regions which are aligned with respect to each other are formed within the substrate by first forming a diffusion mask, such as silicon dioxide, atop the substrate. A resist mask is then applied, exposed and developed lithographically to define a first impurity region pattern. Windows are then etched in the silicon dioxide through the openings in the photoresist down to the substrate; the first impurity regions are then formed in the substrate by introducing impurities through the silicon dioxide windows. To form the other impurity regions, the substrate is typically reoxidized and a second photoresist mask is patterned lithographically to define the openings for the other impurity regions. Windows in the regrown oxide are then etched through the openings in the second photoresist pattern down to the substrate and impurities are introduced therethrough to form the other impurity regions.

This type of technique requires an accurately aligned lithographic mask for each step which involves the introduction of a distinct impurity, whether by diffusion or ion implantation. It is costly in terms of both direct expense for masks as well as reducing the overall yield of usable integrated circuit devices. Any substantial misalignment of the second mask with respect to the first ordinarily results in a defective wafer, which contains hundreds of individual chips.

Other, more recent techniques for forming distinct, aligned impurity regions involve the use of diffusion masks which are selectively etchable with respect to each other. For example, silicon dioxide and silicon nitride are attacked by buffered HF and hot phosphoric acid, respectively, whereas the former acid does not substantially affect silicon nitride and the latter acid does not substantially affect silicon dioxide.

Typically, the nitride is first deposited atop the oxide on the substrate. A single resist mask and conventional lithographic techniques are then used to form in a single step a pattern of openings in the nitride which define both sets of distinct impurity regions. Next, another photoresist mask, which is non-critical in terms of alignment and is commonly termed a "blocking" mask, is applied, exposed and developed to expose only those portions of the silicon dioxide layer which are atop the first set of impurity regions to be formed. The silicon dioxide layer is selectively etched in buffered HF, with the silicon nitride layer itself acting as a mask. The first impurity regions are then introduced into the substrate through the windows in the silicon dioxide layer. A second photoresist masking step is then used to form the second set of impurity regions in substantially the same manner.

This improved process and variations of it, while not requiring critically aligned resist masks, still require the use of separate lithographic masking steps for the formation of each distinct set of regions.

Another technique which has been suggested for forming distinct, aligned impurity regions involves the use of differential thicknesses of the diffusion masking layer, typically silicon dioxide. Such a technique is described for example, in the article by C. H. Lee entitled "Self-Aligning Subcollector and Isolation Regions in a Semiconductor Transistor", IBM Technical Disclosure Bulletin, Volume 20, No. 6, November 1977, pages 2233-34. This technique is similar to the above-described use of selectively etchable diffusion layers in that separate photolithographic masks are required, although they need not be aligned with extreme accuracy.

The previous techniques have been applied to the formation of various types of impurity regions, including those cases where two highly-doped regions are required to be adjacent each other, e.g., the subcollector and isolation regions of a bipolar transistor. It is necessary that such regions not overlap unduly lest dislocations occur within the regions. These problems can be avoided by designing the masking operation to allow for greater distances between the regions, thereby reduces circuit density. Alternatively, the dislocations may be accepted as part of the overall product design; this results in reduced quantities of usable chips based upon the statistical distribution of dislocations and their effect on product performance.

SUMMARY OF THE INVENTION

It is therefore an object of my invention to improve the formation of aligned impurity regions within a semiconductor substrate.

It is another object to reduce the number of lithographic steps needed to form such regions.

It is another object to eliminate the overlap of the peak concentrations of highly-doped, adjacent impurity regions within a semiconductor substrate.

These and other objects are achieved with a process in which the differential oxidation rate between adjacent regions of different impurity concentration formed within the semiconductor is used to advantage.

In one preferred embodiment, a N+ impurity region is formed within a P type substrate; the entire substrate in then oxidized, resulting in a substantially thicker layer of silicon dioxide atop said N+ layer then atop the remainder of the substrate. The wafer is then dip-etched to remove the thin oxide layer. The introduction of P type impurities adjacent the N+ region is then done; and the remainder of the thick oxide layer over the N+ region acts as a mask to prevent the P type impurities from doping the N+ region. Quite suprisingly, this process provides precise control of the parameters of the junction.

My novel process is used to form regions which perform various functions, for example, as the subcollector and isolation region of bipolar transistors, as a tunnel diode, as a transistor having tunnel diode characteristics and as a lateral PNP transistor.

DETAILED DESCRIPTION

The method of integrated circuit fabrication of my invention will be described in terms of detailed fabrication steps used to manufacture the preferred embodiments. To simplify the discussion, conventional processing steps will be described only briefly, whereas those steps relating to the novel aspects of my process will be described in greater detail.

Figure 1A:
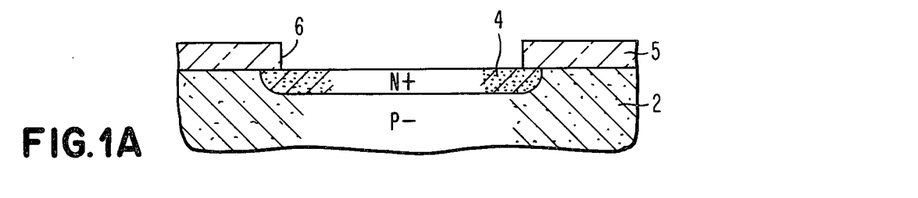
FIGS. 1A-1F are fragmentary, cross-sectional views of a partially completed semiconductor device being formed with my novel process.

Turning now to FIG. 1A, initially using conventional techniques a N+ buried layer 4 is formed in a P− type silicon substrate 2 by diffusing or implanting an impurity, preferably arsenic or phosphorus, into substrate 2 through window 6 in a silicon dioxide mask 5. Typically, P− layer 2 exhibits a resistivity of around 10 to 20 ohm-cm and is around $7 \times 10^{14}$ ions per cm$^3$ surface impurity concentration. The N+ subcollector exhibits a surface impurity concentration of greater than around $10^{20}$ atoms per cm$^3$. The thickness of oxide layer 5 is around 3000 A, which is sufficient to mask substrate 2 from the diffusion of the arsenic or phosphorus into any regions except those exposed in windows 6 in oxide layer 5. An oxide layer (not shown) is also formed on the backside of substrate 2, as is known in the art.

Figure 1B:
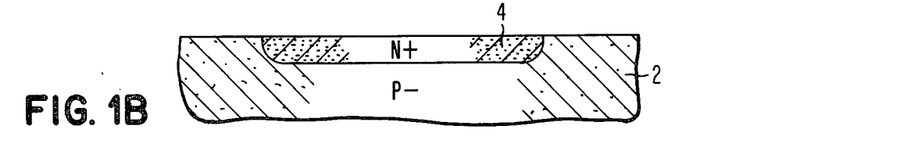

In FIG. 1B oxide layer 5 is stripped from the upper surface of layer 2, thereby exposing the entire surface.

Figure 1C:
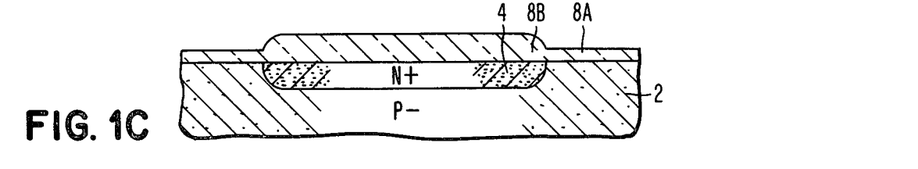

In the process step illustrated in FIG. 1C the surface of substrate 2 is reoxidized, thereby forming a silicon dioxide layer which comprises two distinct parts, enumerated 8A and 8B. These oxide layers exhibit different thicknesses because of the phenomenon, which is understood by those of skill in the semiconductor art, that oxide tends to grow more quickly over a highly doped N type region than over a N type region exhibiting a lower impurity level or over a region of P type conductivity. See, for example, the article by Chappelow et al in IBM Technical Disclosure Bulletin, Volume 16, No. 5, October 1973, pages 1617-1617 A. With the parameters of the impurity regions which have already been discussed, an oxidation in steam at around 1000° C. for around 60 minutes results in an oxide layer 8A of around 2500 A and an oxide layer 8B of around 5000 A, for a differential thickness of 2500 A. As one decreases the oxidation temperature in steam, said differential increases. For example, at 800° C. a 5:1 differential ratio is obtained, a factor which is also known in the art.

The same phenomenon of differential thicknesses occurs whether N+ region 4 is initially formed by conventional diffusion techniques or by ion implantation. Moreover, differentials exist between a N+ region and a N− region. Thus, the scope of my invention embraces any regions over which differential oxidation occurs.

Figure 1D:
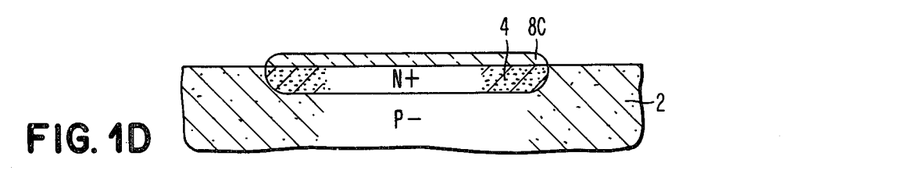

Turning to FIG. 1D the surface of substrate 2 with the exception of N+ regions 4 formed therein are exposed by an etching step. The etching preferably comprises a conventional dip-etching technique in buffered hydrofluoric acid for a time sufficient to remove layer 8A. Alternatively, the oxide layer may be etched by a dry etching process such as reactive ion (plasma) or sputter etching. This leaves a portion of layer 8B, enumerated 8C, in FIG. 1B. For the specific example described above, oxide layer 8C is around 2400 A thick. The etching rate of layer 8B as compared to layer 8A is in practice almost the same, with layer 8B etching more quickly by less than 10%. The remaining oxide 8C is defined by the subcollector 4.

Figure 1E:
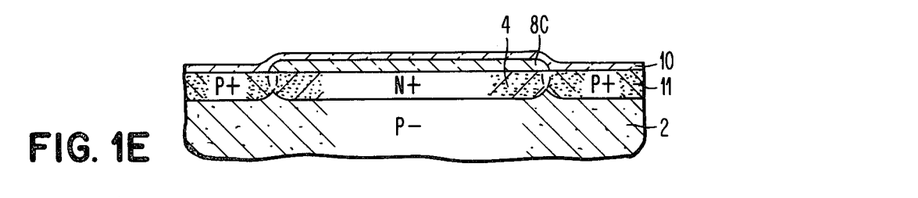

This embodiment of my novel process is essentially completed in FIG. 1E wherein P+ region 11 is formed adjacent N+ region 4. In my preferred process, I deposit a layer 10 of borosilicate glass using BBr$_3$. This is followed by a subsequent drive-in step to form P+ region 11. Oxide layers 10 and 8C are then stripped from the surface of substrate 2, leaving exposed region 4 surrounded by region 11.

It is also possible to form region 11 by ion implantation rather than diffusion. This requires a sufficiently thick oxide layer 8C and low energy implant levels. However, this is difficult to control with present day techniques, particularly when region 11 is to be both highly-doped and relatively deep within substrate 2.

One method comprises performing an implant of P type ions after the step shown in FIG. 1D. Oxide layer 8C is then removed and a drive-in step then performed both to diffuse the P+ region into substrate 2 as well as for annealing purposes.

Figure 1F:
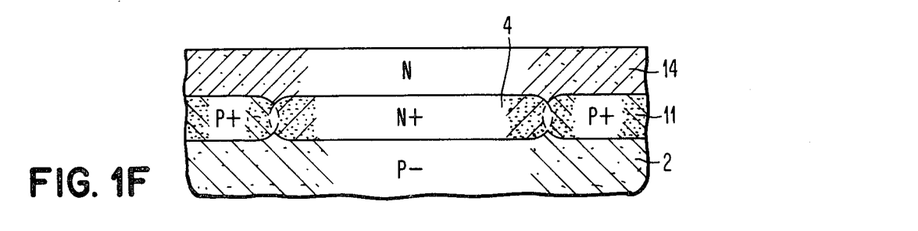

In the typical integrated circuit chip there will be many hundreds or even thousands of N+ regions formed which are surrounded by P+ regions 11. These are used to form the subcollector regions of bipolar transistors which are isolated from other transistors formed in the same chip by P+ isolation regions 11. In FIG. 1F an epitaxial layer 14 is grown atop the substrate by conventional techniques for the subsequent formation of modern integrated circuit devices. The significant feature of the process is the relative lack of overlap at the intersection of regions 4 and 11. Because of this characteristic the breakdown voltage between the collector region 4 and isolation region 11 is precisely controlled even though the regions abut each other. As previously mentioned, this is achieved without the need for a lithography mask to define a spacing between the isolation and subcollector.

Figure 2:
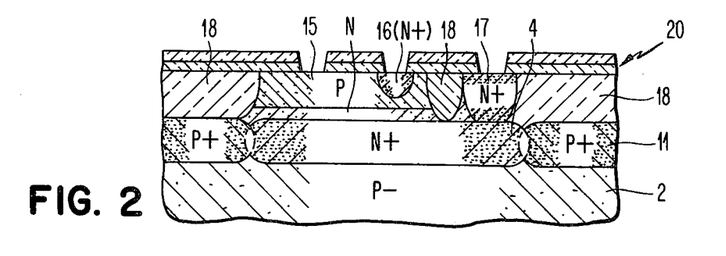
FIG. 2 illustrates a bipolar transistor having subcollector and isolation regions formed in accordance with my novel process.

FIG. 2 illustrates a conventional bipolar transistor structure which utilizes my process for forming the subcollector region 4 and isolation region 11. The transistor is included in the drawing to show a complete mode of operation of my process. The transistor includes emitter region 16 formed in the base region 15 and a subcollector reachthrough contact 17. Apertures are formed within a composite masking layer 20 for the deposition of conductive thins films to function as contacts. As previously mentioned, the transistor is conventional at the present state of the art and no further description is deemed necessary. A recessed oxide isolation region 18 surrounds the active regions of the device and also separates the expitaxial layer from an N+ reach through contact 17.

FIGS. 3A through 3F illustrate the fabrication of a lateral PNP transistor having base and collector regions formed by my novel process. The structure of the transistor in the substrate is not my invention.

Figure 3A:
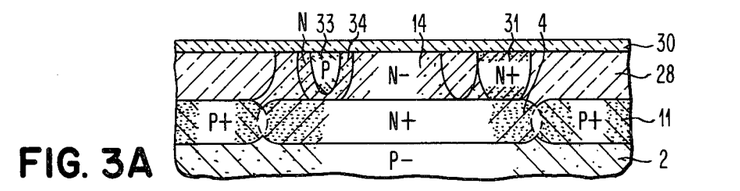
FIGS. 3A-3F are fragmentary, cross-sectional views of the fabrication steps of a lateral PNP transistor which is formed using my novel process.

Turning to FIG. 3A there is shown a partially completed bipolar transistor, with substrate 2, subcollector 4, P+ isolation region 11 and epitaxial layer 14 having the same characteristics as, and enumerated identically with, FIG. 1F.

A P type emitter 33 is formed by conventional techniques within an N type base region 34. The N+ base contact 31, which is also formed by standard techniques, is connected to base region 34 by means of buried region 4 which in this case acts as a buried contact rather than a subcollector. Disposed atop epitaxial layer 14 is a layer of silicon dioxide 30 having a thickness of around 1600 A, which is typically thermally grown. Base region 34 preferably comprises phosphorus atoms which are ion implanted into epitaxial region 14; emitter region 33 is typically boron which is ion implanted into base region 34. The preferred impurity concentrations of the emitter and base region are $1 \times 10^{20}$ atoms/cm$^3$ and $5 \times 10^{18}$ atoms/cm$^3$, respectively.

Figure 3B:
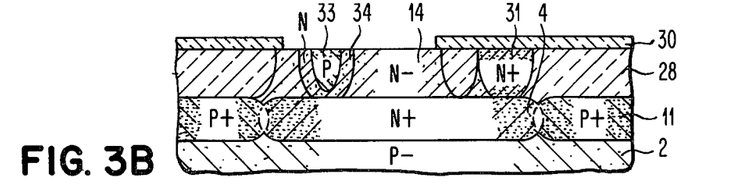

In FIG. 3B an area of epitaxial layer 14 which includes the emitter and base regions is exposed by removing a portion of silicon dioxide layer 30. This may be accomplished by a conventional lithographic blockout masking technique.

Figure 3C:
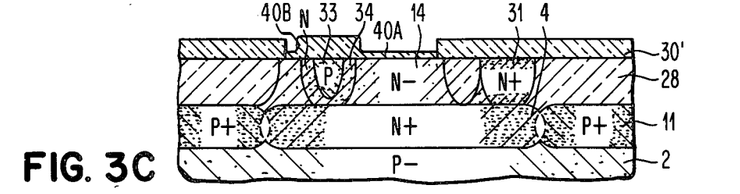

In the process step illustrated in FIG. 3C the surface of epitaxial layer 14 is reoxidized, thereby forming a silicon dioxide layer over the previously exposed epitaxial layer 14 which comprises two distinct parts enumerated 40A and 40B. As previously discussed in the specification with respect to FIG. 1C, these oxide layers exhibit different thicknesses because of the phenomenon that the oxide tends to grow more quickly over highly doped regions then over a layer exhibiting a lower impurity level.

Using a low temperature reoxidation of between 700° C. and 900° C. with steam, the thickness of oxide layer 40B over the emitter and base regions is around 2500 A, whereas the thickness of oxide layer 40A over epitaxial layer 14 is around 1000 A. The thickness of oxide layer 30 is also increased slightly and is now enumerated as 30', although this has no significance with respect to my invention. The low temperature oxidation process allows the use of phosphorus, which is a fast diffusant, as the N type dopant and, in general, disturbs the impurity profile as little as possible.

Figure 3D:
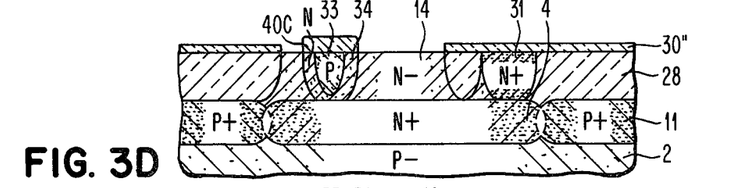

Turning to FIG. 3D, the surface of epitaxial layer 14 which is covered by a layer 40B is exposed by the previously discussed dip-etching step in buffered hydrofluoric acid for a time sufficient to remove layer 40A. Alternatively the oxide layer may be etched by reactive ion (plasma) or sputter etching. This leaves a portion of layer 40B, enumerated 40C, and a portion of layer 30; enumerated 30", in FIG. 1B. For the particular example described above, oxide layer 40C is approximately 1400 A thick. Thus, the oxide island 40C is aligned to base region 34.

Figure 3E:
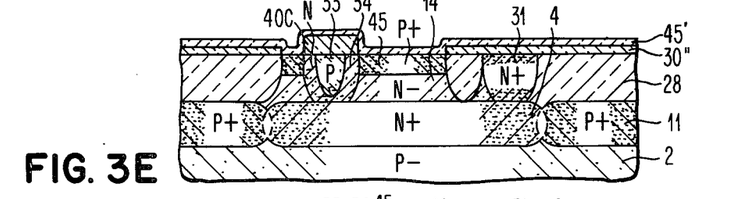

In the next step illustrated in FIG. 3E, the collector 45 of the PNP transistor is formed in the exposed areas of epitaxial layer 14. As with respect to FIG. 1E described previously, this is preferably accomplished by a diffusion of boron by means of a borosilicate glass layer 45' which is followed by a subsequent drivein step to form P+ region 45.

Figure 3F:
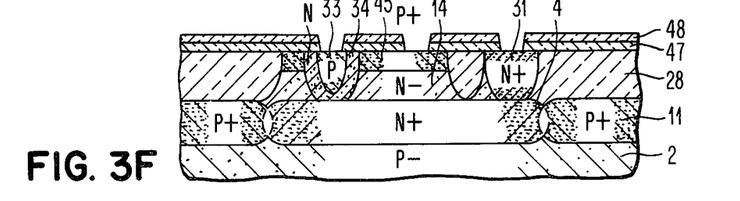

Contacts to the emitter, base and collector regions 33 and 34 and 45, respectively, may be made in a number of ways. As shown in FIG. 3F, oxide layers 45 and 30" are stripped from the substrate and a composite masking layer of silicon dioxide 47 and silicon nitride 48 are deposited. Openings may be photolithographically defined in the composite masking layer for the subsequent deposition of conductive material (not shown) to form ohmic contacts. These steps are well known to those of skill in the art and other techniques are also within the scope of my invention.

Because of the accurate alignment of the diffused P+ atoms, the concentration of the intersection between the adjacent impurity regions 45 and 34 is well-defined without the use of a lithography process. Therefore, the base width of the lateral PNP transistor is narrow, typically around 0.3 micrometer, thereby yielding a high gain transistor with low collector series resistance.

FIGS. 4A–4G illustrate the fabrication of a tunnel diode-transistor structure in integrated circuit form using my novel process. Such a structure is advantageous in integrated circuits because its switching characteristics are substantially faster than ordinary junction diodes formed within a semiconductor substrate. The device structure is not my invention, which resides in the method for forming the tunnel diode junction only.

Figure 4A:
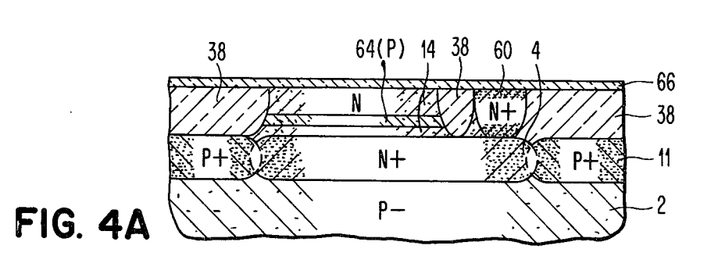
FIGS. 4A-4G are fragmentary cross-sectional views of fabrication steps of a transistor having tunnel diode characteristics which is formed with my novel process.

The structure of FIG. 4A features the same substrate 2, buried N+ region 4, P+ isolation region 11 and epitaxial layer 14 as shown in FIG. 1F and described previously. A recessed oxide isolation region 38 surrounds the active regions of the device and also separates epitaxial layer 14 from a N+ reachthrough region 60. Initially, a thin silicon dioxide layer 66 is grown to a thickness of around 1600 A atop epitaxial layer 14. An intrinsic base implant is then performed to form a buried P type region 64. Typically, this buried region may be formed by ion implantation of boron atoms at an energy level of around 180 Kev and dosage of around $2.0 \times 10^{13}$ ions per cm$^2$ through oxide layer 66. These steps and alternative processes for forming a buried implanted region are well known to those of skill in the semiconductor design art. The intrinsic region 64 serves to control the gain of the NPN transistor to be formed.

Figure 4B:
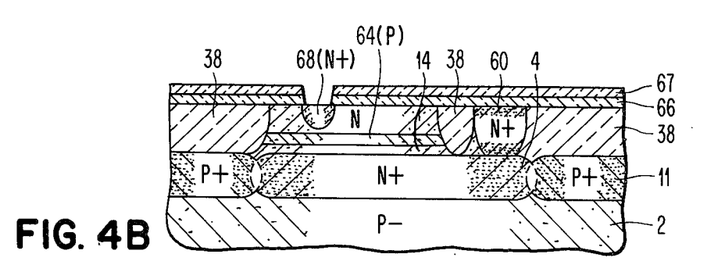

An N+ emitter 68 is then formed in epitaxial layer 14 above P region 64 as shown in FIG. 4B. This is advantageously accomplished by stripping oxide layer 66 from the substrate, forming a composite masking layer 66/67 atop the substrate and exposing a window for regions 68 in said composite layer. Typically, the composite layer comprises silicon dioxide layer 66 and silicon nitride 67. After opening the window in the composite masking layer, arsenic may be either diffused or implanted to form region 68. The surface concentration of the arsenic is approximately $3 \times 10^{20}$ atoms per cm$^3$.

Figure 4C:
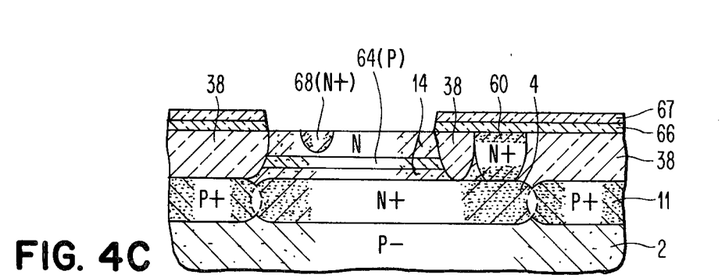

Turning now to FIG. 4C, composite masking layer 67/66 is removed from a limited area of the surface of epitaxial layer 14. This is done by conventional lithographic techniques.

Figure 4D:
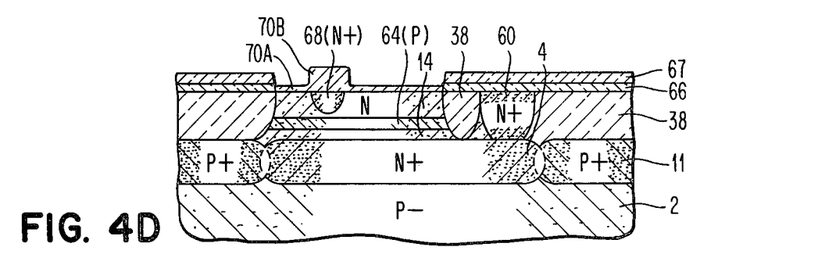

In the step illustrated in FIG. 4D, the surface of epitaxial layer 14 is reoxidized, thereby forming a silicon dioxide layer which comprises two distinct parts enumerated 70A and 70B, the latter being thicker than the former because it is atop highly doped N+ region 68.

Figure 4E:
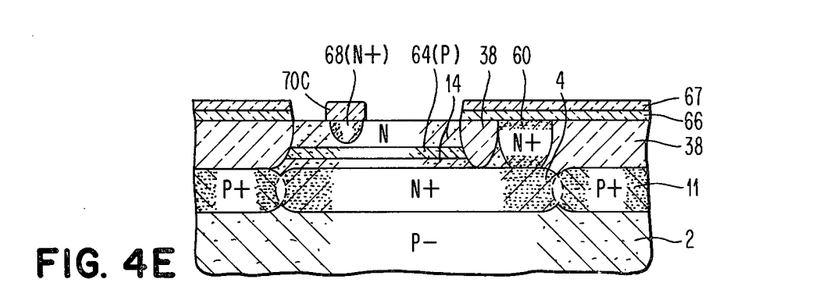
Figure 4F:
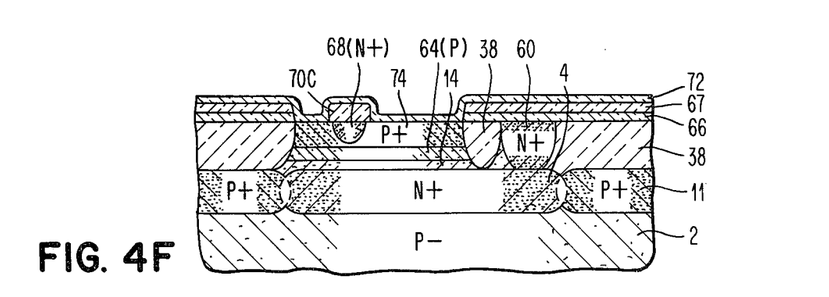
Figure 4G:
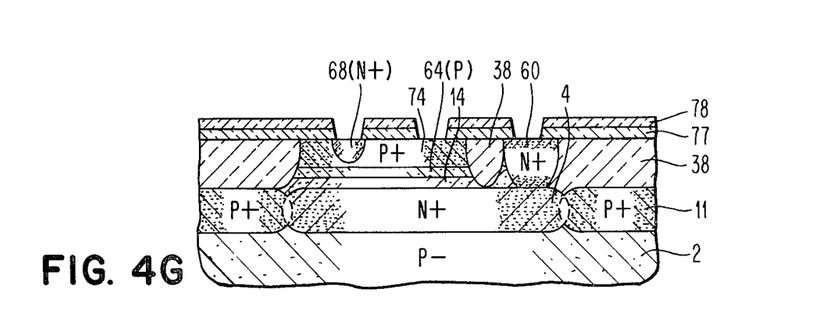

Turning to FIG. 4E the previously exposed portion of epitaxial layer 14 is re-exposed by etching away layer 70A, typically by a conventional dip-etching process in buffered hydrofluoric acid for a time sufficient to remove layer 70A. This leaves the portion of layer 70B, enumerated 70C, in FIG. 6E.

Next, an extrinsic P+ base region 74 is formed around N+ region 68 by the use of a borosilicate glass layer 72. The junction of P+ regions 74 and N+ regions is well-defined because of my novel process.

The surface concentration of P+ region 74 is around $5 \times 10^{19}$ atoms per cm$^3$. The emitter-base regions function as a tunnel diode because both sides of the junction are degenerately doped and the intersection of the profiles are precisely controlled and optimized for tunneling characteristics.

To form ohmic contacts to the various regions of the transistor exhibiting tunnel diode characteristics, layers 66, 67 and 72 are stripped from the surface of the substrate and a new composite masking layer 77, 78 typically silicon dioxide and silicon nitride are deposited and etched by conventional lithographic techniques to leave the desired ohmic contact openings. The metallization for forming the contacts is well known to those of skill in the art and is not illustrated in the drawings.

In summary, I have invented a novel process for forming adjacent impurity regions in a semiconductor substrate, my techniques succeeds in defining the concentration of inner section between the two adjacent regions without the use of a lithographic process. As illustrated in the Figures, my process is expendable to various types of devices and regions formed in integrated circuits.

While my invention has been particularly shown and described with reference to preferred embodiments thereof, it will be understood by those of skill in the art that the foregoing and other changes in form and details may be made therein without departing from the spirit and scope of my invention.

Having thus described our invention, what I claim as new, and desire to secure by Letters Patent is:

1. A method for introducing impurities into a region adjacent a first N type impurity region in a silicon semiconductor substrate, said adjacent region being either a N type region of lower impurity level or a P type region, comprising the steps of:
   oxidizing said substrate to create a mask having a thickness which is greater over said first impurity region than over said adjacent region; removing a portion of said masking layer sufficient to re-expose said adjacent region, but leaving a remainder to protect said first impurity region; and
   introducing said impurities into said adjacent region, said first impurity region being protected from the introduction of said impurities by said remaining masking layer.

2. A method as in claim 1 wherein said removal step is accomplished by etching said oxide layer in buffered hydrofluoric acid.

3. A method as in claim 1 wherein said removal step is accomplished by dry etching.

4. A method as in claim 1 wherein said step of introducing impurities into said adjacent region is accomplished by a diffusion process.

5. A method as in claim 4 wherein:
   said N type impurities are selected from the group consisting of arsenic and phosphorus; and said impurities diffused into said adjacent region are boron.

6. A method as in claim 1 wherein said step of introducing impurities into said adjacent region is by ion implantation.

7. A method as in claim 1 wherein said oxidizing step is accomplished in steam.

8. A method for forming adjacent subcollector and isolation regions of a transistor comprising the steps of:
   introducing impurities of N+ conductivity into a silicon semiconductor substrate having a lower impurity level to form said subcollector region; oxidizing said substrate to create a mask having a thickness which is greater over said subcollector region than over at least a portion of said substrate which is adjacent said subcollector region; removing a portion of said masking layer sufficient to re-expose said substrate portion, but leaving a remainder to protect said subcollector region; and introducing P type impurities into said substrate portion to form said isolation region, said subcollector region being protected from the introduction of said P type impurities by said remaining masking layer.

9. A method as in claim 8 wherein said removal step is accomplished by etching said oxide layer in buffered hydrofluoric acid.

10. A method as in claim 8 wherein said removal step is accomplished by dry etching.

11. A method as in claim 8 wherein said substrate is of P-type conductivity; and said subcollector region exhibits a surface impurity concentration of greater than around $10^{20}$ atoms per cm$^3$.

12. A method as in claim 8 wherein said step of introducing said N+ impurities is accomplished by a diffusion or an ion implantation process.

13. A method as in claim 8 wherein said step of introducing said P type impurities is accomplished by a diffusion process.

14. A method as in claim 8 wherein said oxidizing step is accomplished in steam at around 1000° C. for around one hour.

15. A method for forming adjacent base and collector regions of a lateral PNP transistor comprising the steps of:
   introducing impurities of N type conductivity into a selected region of a section of a silicon semiconductor substrate to form said base region; introducing impurities of P type conductivity into said base region to form an emitter region; said substrate section having a lower impurity level than that of said base and emitter regions;
   oxidizing said substrate to create a mask having a thickness which is greater over said base and emitter regions than over said substrate section; removing a portion of said masking layer sufficient to re-expose said substrate section, but leaving a remainder to protect said base and emitter regions; and introducing P type impurities into said substrate section to form a collector region of said PNP transistor, said base and emitter regions being protected from the introduction of said P type impurities by said remaining masking layer.

16. A method as in claim 15 wherein said removal step is accomplished by etching said oxide layer in buffered hydrofluoric acid.

17. A method as in claim 15 wherein said removal step is accomplished by dry etching.

18. A method as in claim 15 wherein:

said base region impurities are phosphorus; and said oxidizing step is accomplished in steam at between 700° C. and 900° C.

19. A method as in claim 15 wherein said step of introducing said collector impurities is accomplished by a diffusion process.

20. A method for forming a tunnel diode comprising the steps of:

introducing impurities of N+ conductivity into a a selected region of a section of a silicon semiconductor substrate having a lower impurity level to form a degenerately-doped N+ type impurity region; oxidizing said substrate to create a mask having a thickness which is greater over said N+ type region than over said substrate section; removing a portion of said masking layer sufficient to re-expose said substrate section, but leaving a remainder to protect said N+ region; introducing impurities of a P+ conductivity into said substrate section to form a degenerately-doped P type region, said N+ region being protected from the introduction of said second impurity by said remaining masking layer.

21. A method as in claim 1 wherein said removal step is accomplished by etching said oxide layer in buffered hydrofluoric acid.

22. A method as in claim 21 wherein said removal step is accomplished by dry etching.

23. A method as in claim 21 wherein:

said N+ impurity region comprises arsenic exhibiting a surface concentration of around $3 \times 10^{20}$ atoms per $cm^3$; and said P+ impurity region comprises boron exhibiting a surface concentration of around $5 \times 10^{19}$ per $cm^3$.

* * * * *

UNITED STATES PATENT AND TRADEMARK OFFICE
CERTIFICATE OF CORRECTION

PATENT NO. : 4,151,010
DATED : April 24, 1979
INVENTOR(S) : George R. Goth

It is certified that error appears in the above-identified patent and that said Letters Patent are hereby corrected as shown below:

Column 10, line 6     Change "claim 1" to ---claim 20---;
(Claim 21)

Column 10, line 9     Change "claim 21" to ---claim 20---;
(Claim 22)

Column 10, line 11    Change "claim 21" to ---claim 20---.
(Claim 23)

Signed and Sealed this

Ninth Day of August 1983

[SEAL]

Attest:

GERALD J. MOSSINGHOFF

*Attesting Officer*     *Commissioner of Patents and Trademarks*